United States Patent [19]

Bailey et al.

[11] Patent Number: 5,401,677
[45] Date of Patent: Mar. 28, 1995

[54] METHOD OF METAL SILICIDE FORMATION IN INTEGRATED CIRCUIT DEVICES

[75] Inventors: Robert D. Bailey, South Burlington, Vt.; Cyril Cabral, Jr., Ossining, N.Y.; Brian Cunningham, Highland, N.Y.; Hormazdyar M. Dalal, Milton, N.Y.; James M. Harper, Yorktown Heights, N.Y.; Viraj Sardesai, Poughkeepsie, N.Y.; Horatio S. Wildman, Wappingers Falls, N.Y.; Thomas O. Williams, Middletown, N.Y.

[73] Assignee: International Business Machines Corporation, Armonk, N.Y.

[21] Appl. No.: 173,313

[22] Filed: Dec. 23, 1993

[51] Int. Cl.⁶ .................. H01L 21/44; H01L 21/48
[52] U.S. Cl. ........................ 437/200; 437/178; 437/179; 437/201
[58] Field of Search ............... 437/195, 192, 201, 200, 437/178, 179

[56] References Cited

U.S. PATENT DOCUMENTS 4,398,341 8/1983 Geipel, Jr. et al. ................. 437/200
4,804,438 2/1989 Rhodes ................................ 437/202

OTHER PUBLICATIONS

Wolf, Silicon Processing for the VLSI Era vol. 2 pp. 117–119 and 144–151, 1990.

*Primary Examiner*—Olik Chaudhuri
*Assistant Examiner*—H. Jey Tsai
*Attorney, Agent, or Firm*—Whitham, Curtis, Whitham & McGinn; Michael J. Balconi-Lamica

[57] ABSTRACT

An improved process for the formation of high quality, high yield platinum silicides on silicon wafers uses a post sputter platinum deposition and high vacuum bake to complete the first step of silicide reaction, resulting in $Pt_2Si$ formation before sinter. This additional process step is then followed by a 500° to 900° C. sinter. The use of a high vacuum bake provides easy control of $O_2$ and $H_2O$ impurities. The vacuum bake can be done in any high vacuum tool. The bake temperatures range from 200° to 450° C. at $5 \times 10^{-6}$ torr, with an in-situ bake time of 3 to 5 minutes or an ex-situ bake time of 10 to 30 minutes, depending on batch size or tool. A particular advantage of the process is that it can be performed in existing tools.

6 Claims, 2 Drawing Sheets

METHOD OF METAL SILICIDE FORMATION IN INTEGRATED CIRCUIT DEVICES

BACKGROUND OF THE INVENTION

1. Field of the Invention

The present invention generally relates to large scale integrated (LSI) semiconductor circuit manufacturing processes and, more particularly, to the formation of high quality, high yield metal silicide films used to form diodes and/or to make ohmic contacts.

2. Description of the Prior Art

Platinum silicide (PtSi) is traditionally used for low ohmic contact resistance and for high barrier Schottky barrier diodes (SBDs), infrared (IR) light sensitive diodes, and the like. The basic steps in forming PtSi involve:

a) Non-photo galvanic etch for silicon contact cleaning;
b) Pt deposition;
c) 550° C. $N_2$ sinter; and
d) Aqua regia etch to remove unreacted Pt and a sulfuric acid based cleaning to remove any carbonaceous residue.

For Pt deposition, two techniques are used:

a) By evaporation of Pt with a 350° C. substrate temperature. This technique has shown advantages in producing complete PtSi, less sinter condition dependence and clean PtSi/Si interface with excellent SBD characteristics. Disadvantages are: (i) Limited lateral spreading giving an annular ring devoid of Pt; (ii) Long cycle time due to slow cool down; (iii) PtSi creep along sidewall; and (iv) Pt nodule formation.

b) By sputter deposition at room temperature. The advantage is less cycle time. Disadvantages are: (i) Extreme sensitivity to sinter condition; (ii) Incomplete PtSi conversion giving missing PtSi and low forward voltage ($V_f$) SBD; (iii) PtSi creep along walls; and (iv) Pt nodule formation.

For contamination reduction, better process control and automation, a sinter furnace is used where the sinter tube is isolated from atmosphere with circulating $N_2$. This reduces $O_2$ in the sinter tube whereby no protective $SiO_2$ layer is formed on the PtSi. This results in a massive missing PtSi problem. Addition of any $O_2$ in the $N_2$ results in incompletion of the PtSi reaction and again results in similar massive missing PtSi. A similar problem has been observed with an open sinter tube when there is any deviation in the sinter process or a crack in the tube or even poor vacuum in sputter tool.

The sinter process actually consists of two silicide formation reactions steps and a passivation oxide formation step, namely:

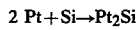

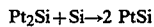

Since these reactions take place simultaneously and the first two compete with the third, incomplete PtSi formation results. Poor passivation also results in scalloping, or missing PtSi, after the aqua regia etch.

SUMMARY OF THE INVENTION

It is therefore an object of the present invention to provide an improved process for the formation of high quality, high yield metal silicides on silicon wafers.

It is a more specific object of the invention to provide an improved process for forming platinum silicide films used for low ohmic contact resistance elements in large scale integrated circuits.

According to the invention, a post platinum deposition high vacuum bake completes the first step of silicide reaction, resulting in $Pt_2Si$ formation. This additional process step is then followed by a 550° C. sinter. The use of a high vacuum bake provides easy control of $O_2$ and $H_2O$ impurities. The vacuum bake can be done in any high vacuum tool. The bake temperatures range from 250° to 350° C. at $\sim 5\times 10^{-6}$ Torr, with a bake time of 2 to 30 minutes, depending on in-situ or ex-situ bake, batch size or tool. A particular advantage of the process is that it can be performed in existing tools.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

A detailed study was undertaken where Pt—Si reaction was studied at various stages by Auger, TEM and calorimetry. All three methods of analyses indicated the same mechanism for Pt—Si reaction. The mechanism given here is for Pt sputter deposited at room temperature. The as deposited Pt, at room temperature, is in a distinct layer having no discernable reaction with Si. The Pt—Si reaction can broadly be divided into three stages as follows:

  (1)

  (2)

  (3) (silicon diffusing through PtSi and reacting with ambient $O_2$)

Considering the first reaction, $2\ Pt+Si\rightarrow Pt_2Si$, the reaction depends mainly upon:

i) surface cleanliness;
ii) Residual gases in Pt deposition tool;
iii) reaction temperature (time is 10 sec to 1 min at 350° C. for 400 Å Pt); and
iv) $O_2$ content in ambient at temperature.

Surface Cleanliness

The silicon surface on which PtSi is to be formed is generally "opened" contact holes. Three kinds of contamination are observed:

a) Minute ($\simeq$50 Å) $SiO_2$ residue, especially along the periphery giving ($Pt_xSi_yO_z$) compound with "scallop" morphology;

b) Carbonaceous film formed during $CF_4$ RIE opening of contacts, all the way down to the Si surface. This is generally known as "polymer" formation by reactive ion etch (RIE). In earlier technologies this was avoided by RIE opening the contacts part way and then wet etching to the Si-surface. Dense and small contacts in new technologies limits the net etch to minimum. One method of removing this polymer is oxidizing this polymer film by heating wafers at 700° to 900° C. in $O_2$ to form about 200 Å $SiO_2$ and then wet etching to remove this oxide;

c) At times, it is observed that BHF used for precleaning the contacts prior to Pt deposition, plates back an organic layer if the same BHF bath is also used to clean wafers with an organic coating. This is taken care by having dedicated BHF bath for Pt pre-clean.

Residual Gases in Pt Tool

The major source of residual gas in vacuum deposition tools have been organic vapors from pump oil, and a leak in the system. The as deposited Pt film may have oxygen, nitrogen, and/or carbon incorporated in the film; but usually these gases form a contamination layer of "Si-O, C, N" on the silicon surface or at the Pt/Si interface. This is a tool dependent problem.

Reaction Temperature $Pt_2Si$ formation is time-temperature dependent and can easily be formed at 200° C. in about 30 minutes in a high vacuum condition. The lower the temperature, the longer is the time required, and that gives more chance for impurity to react and cease the reaction as mentioned below. At 300° C., reaction time for 400 Å Pt to react with silicon, forming about 675 Å of $Pt_2Si$ in a high vacuum condition is about 10 to 50 seconds.

Figure 1:
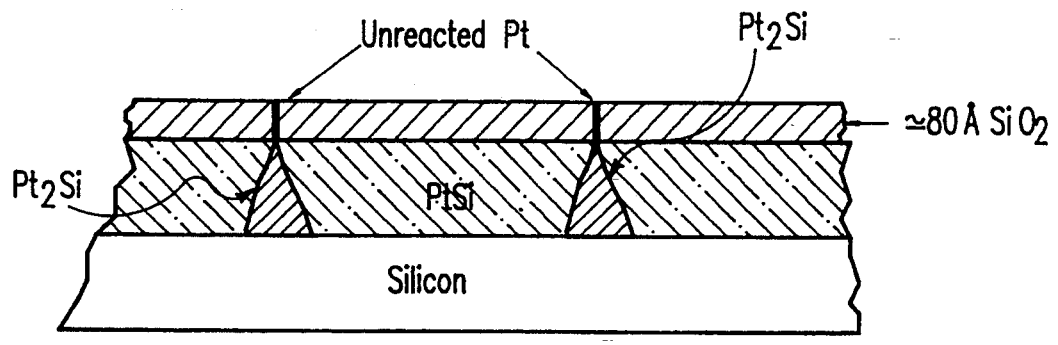
FIG. 1 is a cross-sectional view showing the environmental effect of oxygen at the Pt/Si interface or on the Si surface during $Pt_2Si$ formation.

Environment Effect $Pt_2Si$ formation is severely affected by the presence of oxygen. This oxygen may be present in the silicon surface, at the interface between Pt and Si, or in the ambient during sintering. If oxygen is at the interface or on the Si surface, then we see mostly $Pt_2Si$ with oxygen giving brown appearance, rough in texture and high contact resistance. This may also be accompanied by a fair amount of unreacted Pt on the top surface as shown in FIG. 1.

Figure 2:
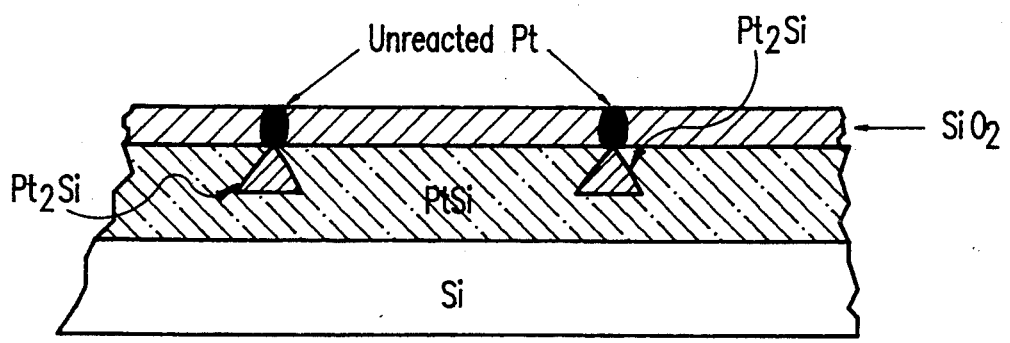
FIG. 2 is a cross-sectional view showing the environmental effect of oxygen in the sinter ambient.

If oxygen is in the sinter ambient, greater than a "certain" amount (which is not yet determined), then the 2 $Pt+Si \rightarrow Pt_2Si$ reaction does not go to completion and one sees unreacted Pt and absence of $SiO_2$ on top surface, as shown in FIG. 2, and thereby silicide etches during aqua regia etch.

The second reaction, $Pt_2Si+Si \rightarrow 2$ PtSi, is a rapid mechanism, but does not depend upon oxygen in the environment; however, this reaction seems to be arrested if $Pt_2Si$ contains oxygen in Pt as in i, ii or iii above. It is for this reason that it is of the utmost importance to have the 2 $Pt+Si \rightarrow Pt_2Si$ reaction in a high vacuum condition.

During the third reaction, $Si+O_2 \rightarrow SiO_2$, silicon diffuses through PtSi to the top surface and reacts with residual oxygen in ambient forming $SiO_2$.

This study of the mechanism throws light on a very paralysing problem of silicide creep causing device leakage between anode-cathode of an SBD etch, and it also throws light on missing PtSi problem causing low $V_f$. The mechanism of missing speckles of PtSi is already discussed above. The PtSi creeping along sidewall takes place when all of the following conditions are met:

(i) Pt deposited in clean Si at room temperature;
(ii) Directly inserted sinter tube at 550° C.;
(iii) Very small or no $O_2$ in sinter ambient; or
(iv) Pt deposited at temperature $\geq$400° C. in high vacuum or deposited at room temperature and held >400° C. for >10 minutes.

Under any of the above conditions the reaction continues

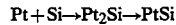

$$Pt+Si \rightarrow Pt_2Si \rightarrow PtSi$$

until all the Pt on the wafer is convened to PtSi, which may never cease as the reaction rate becomes very slow. In this case, PtSi is formed along sidewall and may also bridge between adjacent contact. Further, since PtSi formation has not seized, this gives no chance for diffusing silicon to react with oxygen to form $SiO_2$, hence PtSi etches out in aqua regia.

To prevent this PtSi creep and/or PtSi etch out during the aqua regia etch requires:

a) Temperature-break between $Pt_2Si$ formation and beginning of PtSi formation; or
b) Oxygen in the sinter tube.

PtSi formation, where Pt is deposited by sputtering, has so far always been deposition at room temperature and direct sinter at 550° C. in $N_2$ where a certain, unspecified amount of $O_2$ is present.

Figure 3:
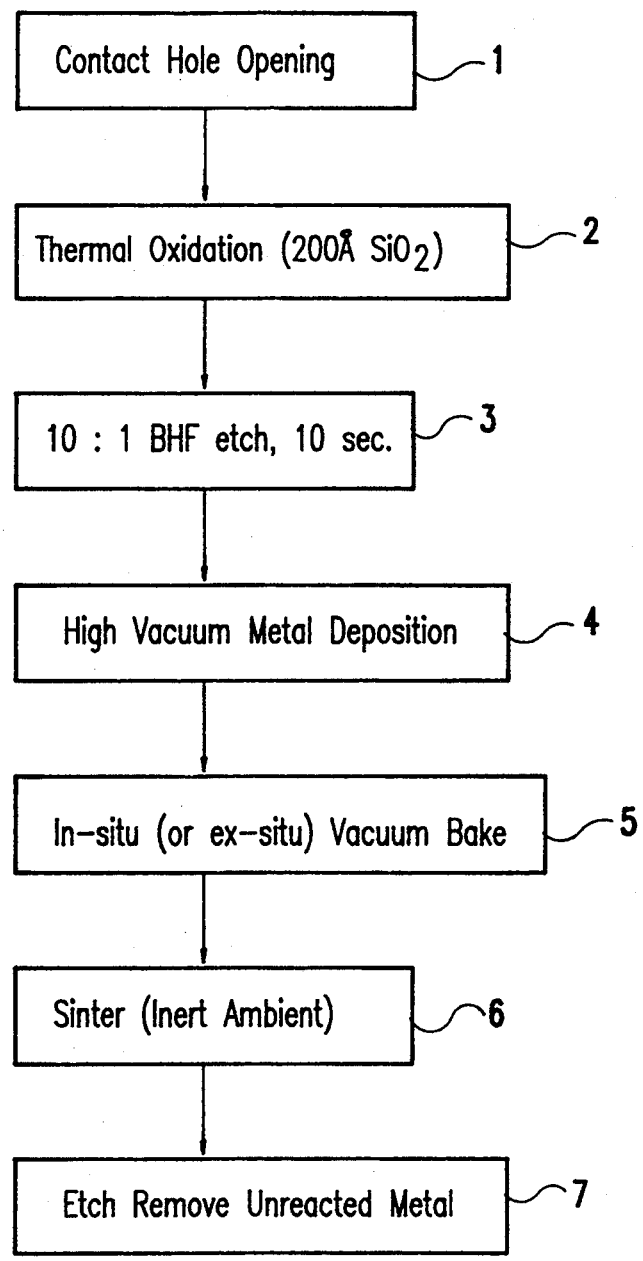
FIG. 3 is a flow diagram showing the process of forming platinum silicide according to a preferred embodiment of the invention.

It could be easily seen from the mechanism described above that this method works by default. It is therefore not surprising that this process burps every now and then giving yield losses. The process, shown in FIG. 3 and described below, is applicable to any silicide, high yield, small turn around time, least process dependent and best device characteristics:

The first step in the process, as shown in FIG. 3, is to open contact holes at step 1. Partway reaction ion etch (RIE) and the rest by wet etch is the preferred method; however, if the dense circuitry dictates RIE opening the contacts all the way to silicon, then, after RIE opening of contacts, step 2 is to thermally grow $\sim$200 Å $SiO_2$ followed in step 3 by BHF etching out that oxide just prior to Pt deposition.

Step 4 is Pt deposition. RF sputtering is preferred; however, E-beam evaporation is equally good. Deposit 250 to 600 Å Pt at room temperature. After Pt deposition, step 5 is a vacuum bake. It is best if in-situ bake could be achieved, i.e., after Pt deposition, without breaking vacuum, by heating wafers to between 200° to 450° C., and preferably 350° C. for 3 to 5 minutes. This is most easily accomplished in a cluster sputter system where, in one port, the chuck is maintained at 350° C. while the Pt is deposited in another port with chuck at room temperature. After Pt deposition at room temperature, the wafer is placed on the heated chuck for three minutes. This time and temperature is adequate to convert all Pt to $Pt_2Si$. The wafer is then cooled and removed from the tool. This allows for continuous operation of one wafer after other. Forming $Pt_2Si$ in vacuum and volume contraction due to temperature change just after $Pt_2Si$ formation prevents sidewall creeping. An ex-situ bake for 10 to 30 minutes may be substituted for the in-situ bake.

Step 6 is to sinter the baked substrate. Sintering is done in $N_2$ between 500° and 900° c., and at 550° C. for about ten to thirty minutes. $\geq$1 ppm $O_2$ region is always present in the N$_2$. Finally, in step 7, the substrate is etched in aqua regia for twenty minutes at $\simeq$60° C. to remove unreacted metal.

While the invention has been described in terms of a single preferred embodiment, those skilled in the art will recognize that, given the guiding principles and theories set forth herein, alternate embodiments of the processes, materials and structures of the present invention can be practiced with modification within the spirit and scope of the appended claims. For example, other silicides may be formed by substituting Ti, W, Pd, Co, Ni, Ta, or Rh for Pt. The inert gas used in the sintering steps may be, in addition to or in combination with N, Ar or H, and the etching may be done using any suitable wet or dry chemical agent.

Having thus described our invention, what we claim as new and desire to secure by Letters Patent is as follows:

1. A method of platinum silicide (PtSi) formation on a substrate comprising the steps of:
    providing a silicon substrate;
    forming contact holes in the substrate;
    sputter depositing 250 to 650 Å of platinum upon the substrate at room temperature to fill the contact holes;
    vacuum baking the substrate at a temperature in the range of 250° to 350° C. and pressure of $\sim 5 \times 10^{-6}$ Torr for a prescribed time between 2 to 30 minutes;
    sintering the substrate at 550° C. in a nitrogen gas atmosphere for approximately 10 to 30 minutes; and
    etching the substrate in an aqua regia etch at a temperature of approximately 60° C. for 20 minutes.

2. The method of claim 1, wherein the vacuum baking step comprises an ex-situ vacuum bake and the prescribed time is 10 to 30 minutes.

3. The method of claim 1, wherein the vacuum baking step comprises an in-situ vacuum bake and the prescribed time is 3 to 5 minutes.

4. A method of metal silicide formation on a silicon substrate comprising the steps of:
    forming contact holes in the substrate to expose silicon;
    annealing the substrate after contact hole opening in dry oxygen to form about 200 Å SiO$_2$;
    wet etching the annealed substrate in buffered hydrofluoric acid to remove the oxide layer;
    vacuum depositing a metal film at room temperature on the substrate;
    vacuum baking the substrate with deposited metal film at 200° to 450° C.;
    sintering the baked substrate at 500° to 900° C. in inert gas ambient; and
    then etching the substrate to remove unreacted metal.

5. A method of platinum silicide (PtSi) formation on a silicon wafer in the manufacture of integrated circuit devices comprising the steps of:
    forming passivating layers on the silicon wafer;
    forming contact holes in the passivating layers by reactive ion etching to expose silicon surfaces on the wafer;
    annealing the wafer after contact hole opening in dry oxygen to form about 200 Å SiO$_2$;
    wet etching the annealed wafer in buffered hydrofluoric acid to remove the oxide layer;
    sputter depositing 250 to 650 Å of platinum upon the wafer at room temperature to fill the contact holes;
    vacuum baking the substrate at a temperature in the range of 250° to 350° C. and pressure of $\sim 5 \times 10^{-6}$ Torr for a prescribed time between 2 and 30 minutes;
    sintering the substrate at 550° C. in a nitrogen gas atmosphere for approximately 10 to 30 minutes; and
    etching the substrate in an aqua regia etch at a temperature of approximately 60° C. for 20 minutes.

6. The method recited in claim 5 wherein the wet etching step is performed with a 10:1 buffered hydrofluoric acid for approximately 10 seconds.

* * * * *